US006992354B2

(12) United States Patent
Nowak et al.

(10) Patent No.: US 6,992,354 B2
(45) Date of Patent: Jan. 31, 2006

(54) FINFET HAVING SUPPRESSED PARASITIC DEVICE CHARACTERISTICS

(75) Inventors: Edward J. Nowak, Essex Junction, VT (US); BethAnn Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,086

(22) Filed: Jun. 25, 2003

(65) Prior Publication Data

US 2004/0262688 A1    Dec. 30, 2004

(51) Int. Cl.
    *H01L 31/0392* (2006.01)
(52) U.S. Cl. .................................... 257/347; 257/344
(58) Field of Classification Search .............. 257/347, 257/296, 327, 344
    See application file for complete search history.

(56) References Cited

U.S. PATENT DOCUMENTS

| | | | |
|---|---|---|---|
| 5,119,153 A | 6/1992 | Korman et al. ............ 357/23.4 |
| 5,122,848 A | 6/1992 | Lee et al. .................. 357/23.6 |
| 5,356,824 A | 10/1994 | Chouan et al. ............... 437/41 |
| 5,604,368 A | 2/1997 | Taur et al. .................. 257/348 |
| 5,646,058 A | 7/1997 | Taur et al. .................... 437/40 |
| 5,773,331 A | 6/1998 | Solomon et al. ............ 438/164 |
| 5,793,082 A | 8/1998 | Bryant ....................... 257/330 |
| 5,804,848 A | 9/1998 | Mukai ........................ 257/270 |
| 5,899,710 A | 5/1999 | Mukai ........................ 438/156 |
| 6,214,670 B1 | 4/2001 | Shih et al. .................. 438/259 |
| 6,215,156 B1 | 4/2001 | Yang ........................... 257/360 |
| 6,252,284 B1 * | 6/2001 | Muller et al. ............... 257/412 |
| 6,297,531 B2 | 10/2001 | Armacost et al. ........... 257/329 |
| 6,406,962 B1 | 6/2002 | Agnello et al. ............. 438/268 |
| 6,413,802 B1 * | 7/2002 | Hu et al. ..................... 438/151 |
| 6,475,869 B1 | 11/2002 | Yu .............................. 438/303 |
| 2002/0008280 A1 | 1/2002 | Armacost et al. ........... 257/330 |
| 2002/0171107 A1 | 11/2002 | Cheng et al. ............... 257/347 |
| 2003/0178677 A1 * | 9/2003 | Clark et al. ................. 257/347 |
| 2004/0222477 A1 * | 11/2004 | Aller et al. ................. 257/412 |

FOREIGN PATENT DOCUMENTS

EP    0763851    3/1997

OTHER PUBLICATIONS

A *Bulk-Si-compatible Ultrathin-body SOI Technology for sub-100nm MOSFETs*; V. Subramanian, J. Kedzierski, N. Lindert, H. Tam, Y. Su, J. McHale, K. Cao, T-J. King, J. Bokor, & C. Hu; Department of Electrical Engineering and Computer Sciences, University of California, Berkeley, CA, date unknown.

(Continued)

*Primary Examiner*—Douglas W. Owens
(74) *Attorney, Agent, or Firm*—Downs Rachlin Martin PLLC

(57) ABSTRACT

A finFET (100) having sidewall spacers (136, 140) to suppress parasitic devices in the upper region of a channel and at the bases of source(s) and drain(s) that are artifacts of the fabrication techniques used to make the finFET. The FinFET is formed on an SOI wafer (104) by etching through a hardmask (148) so as to form a freestanding fin (120). Prior to doping the source(s) (124) and drain(s) (128), a layer (156) of thermal oxide is deposited over the entire finFET. This layer is etched away so as to form the sidewall spacers at each reentrant corner formed where a horizontal surface meets a vertical surface. Sidewall spacers (136) inhibit doping of the upper region of source(s) and drain(s) immediately adjacent the gate. Sidewall spacers (140) fill in any undercut regions (144) of BOX layer (116) that may have been formed during prior fabrication steps.

13 Claims, 5 Drawing Sheets

OTHER PUBLICATIONS

A *Folded-channel MOSFET for Deep-sub-tenth Micron Era*; Digh Hisamoto, wen-Chin Lee, Jakub Kedzierski, Erik Anderson, Hideki Takeuchi Kazuya Asano, Tsu-Jae King, Jeffrey Bokor, and Chenming Hu; Central Research Laboratory, Hitachi Ltd., EECS, UC Berkley, Lawrence Berkely Laboratory, Nippon Steel Corp., NKK Corp; 0-7803-4777- Mar. 1998—1998 IEEE.

*Sub 50-nm FinFET: PMOS*; Xuejue Huang, Wen-Chin Lee, Charles Kuo, Digh Hisamoto, Leland Chang, Jakub Kedzierski, Erik Anderson, Hideki Takeuchi Yang-KYU Choi, Kazuya Asano, Vivek Subramanian, Sciences, University of California at Berkeley, CA; 0-7803-5413-Mar. 1999; 1999 IEEE.

*A Fully Depleted Lean-Channel Transistor (DELTA)—A Novel Vertical Ultrathin SOI MOSFET*; Digh Hisamoto, Toru Kaga, Yoshifumi Kawamoto and Edi Takeda; IEEE Electron Device Letters, vol. 11, No. 1, Jan. 1990; 0741-3106/90/0100-0036S01.00.

* cited by examiner

FINFET HAVING SUPPRESSED PARASITIC DEVICE CHARACTERISTICS

BACKGROUND OF INVENTION

1. Field of the Invention

The present invention relates generally to the field of microelectronics. More particularly, the present invention is directed to a method of making a finFET having suppressed parasitic device characteristics.

2. Background

As the physical size of semiconductor devices, such as transistors, continues to decrease with each new generation of integrated circuit (IC) fabrication technology, consequences of these smaller sizes create new challenges that designers and fabricators must overcome to make the ICs functional. In the field of MOSFETs (metallic oxide semiconductor field effect transistors), which are some of the most common semiconductor devices used today, the decrease in size and commensurate decrease in operating current have led to current leakage becoming problematic when the transistor is in its off state. This leakage is caused by, among other things, parasitic devices that form in the substrate beneath the gate of the FET. Generally, a parasitic device is, among other things, a pathway for current to flow when and/or where such current flow is not desired. Parasitic devices are typically caused by imperfect fabrication and other physical limitations. In conventional planar CMOS technology wherein FETs are formed on a full-thickness silicon wafer, a primary parasitic device can form in the channel between the source and drain beyond a certain depth beneath the gate where the gate's field is no longer effective.

One solution to this current leakage problem for planar FETs is to provide a second gate beneath the channel (such FETs are known as dual gate FETs, or DG FETs). The second gate generally provides two functions: it 1) provides a lower boundary for the channel and 2) provides a second field for regulating the current flow through the channel. While DG MOSFETs have definite advantages over single gate MOSFETs, they have some drawbacks. These drawbacks include relative difficulty in forming the lower gate and difficulty in properly aligning the two gates one above the other.

Relatively recently, a new sort of DG MOSFET has been introduced in conjunction with silicon on insulator (SOI) technology that overcomes some of the drawbacks of planar DO MOSFETs. As seen in FIG. 1A, this new DG MOSFET 10 is formed vertically rather than horizontally and has been given the name finFET, since the structure 12 that contains each pair of source 14 and drain 18 resembles a fin. As mentioned, finFET 10 is typically made using a SOI wafer 22 that includes a buried oxide (BOX) layer 26 sandwiched between a silicon lower layer 30 and a silicon upper layer 34. In the case of finFET 10, much of upper layer 34 has been etched away to define two parallel fins 12 that each form one source 14, one drain 18 and a channel 42 (FIG. 1B) between the source and drain. After fins 12 have been formed, subsequent processing steps include forming a gate oxide (not shown) on fins 12 and foradug gate 46, which is common to both fins. Once gate 46 has been formed, sources 14 and drains 18 are doped, as illustrated by arrows 50, to achieve the proper doping. Doping is typically done using ion implantation front the front side of wafer 22, typically at an angle of about 30 degrees relative to a normal from the wafer so that ions can enter each fin 12 along its entire height without interference from an adjacent fin.

In FIG. 1A it is readily seen that finFET 10 avoids the problem in planar CMOS technology of having to form a second gate beneath the channel of the FET. FinFET 10 also overcomes the problem in planar CMOS technology of having to align gates above and below the channel. Since fins 12 are free-standing structures prior to the formation of gate 46, the portions of the gate on either side of each channel 42 (FIG. 1B) are largely self-aligned as a result of forming the gate perpendicular to the fins.

Although finFETs overcome some of the fabrication challenges of comparable planar CMOSFETs, they presently have several drawbacks that are essentially artifacts of the fabrication process. Referring to FIG. 1B, one of these drawbacks is the formation of a parasitic device 54 adjacent the top of channel 42. Parasitic device 54, when present, is typically an artifact of the processes of removing the hardmask 56 needed to form fins 12 subsequent to the formation of gate 46 and doping source 14 and drain 18. After gate 46 is formed, hardmask 56 is typically removed from the portions of each fin 12 not underneath the gate using a dilute hydrofluoric acid etch. However, this etch is isotropic, so that when hardmask 56 is removed, portions of the hardmask and/or the gate oxide layer (not shown) under gate 46 adjacent the lateral sides of the gate are etched so as to undercut the portion of the gate above each fin 120. During doping of source 14 and drain 18, the upper region of fin 12 out from underneath gate 46 receives additional doping due its exposure to the ion implantation doping of the source and drain during the doping of both sides of the fin (see FIG. 1A, arrows 50). This additional doping causes the concentration of dopant atoms adjacent to the top of source 14 and drain 18 to generally be higher than the doping in other regions of the source and drain. Consequently, this higher doping results in greater lateral diffusion of dopant atoms into channel 42 at the upper portion of the channel. This is illustrated by doping profiles 58 that represent the extent of diffusion of dopant atoms into channel 42. The presence of source and drain dopant atoms at these locations causes the effective length to be shorter in this region of channel 42, thereby creating parasitic device 54 that can interfere with the desired flow of current through the channel. In addition, since hardmask 56 is no longer present at the undercut regions of gate 46, dopant atom can enter into each fin 12 at these undercut regions, thereby causing dopant atoms to be implanted relatively far into channel 42 relative to the lateral sides of gate 46. These additional dopant atoms further interfere with the desired current flow characteristics of channel 42.

Another drawback of present finFETs that is also an artifact of fabrication, is the formation of corner-type parasitic devices at the bottoms of sources and drains. These parasitic devices are the result of the BOX layer being pulled down and undercut (see FIG. 7 element no. 144) at the bottoms of each source and drain. This undercutting is due to other steps in the formation of the finFET, such as the wet etch step used to remove residue polymers left behind by the etching of a gate, which is typically polysilicon.

SUMMARY OF INVENTION

In one aspect, the present invention is directed to a method of suppressing parasitic device characteristics in a finFET. The method comprises the step of forming a finFET so as to define a plurality of reentrant corners formed where each horizontal surface meet a vertical surface. A layer of a material is then deposited over the finFET. The layer is then removed so as to leave a portion of the layer only substantially at each of the plurality of reentrant corners so as to form a plurality of spacers.

In another aspect, the present invention is directed to a device comprising an integrated circuit formed on a substrate and comprising a plurality of FETs. At least some of the plurality of FETs are finFETs each comprising a fin having a source portion, a drain portion and a channel portion extending between the source portion and the drain portion. Each of the source portion and the drain portion have an upper surface and a length extending away from the channel portion. A gate located at the channel portion so as to define a first reentrant corner between the upper surface of the source portion and the gate and a second reentrant corner between the upper surface of the drain portion and the gate. A first spacer is located proximate the first reentrant corner and a second spacer is located proximate the second reentrant corner. The first spacer extends a distance away from the gate in a direction along the source portion less than the length of the source portion. The second spacer extends a distance away from the gate in a direction along the drain portion a distance less than the length of the drain portion.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 2:
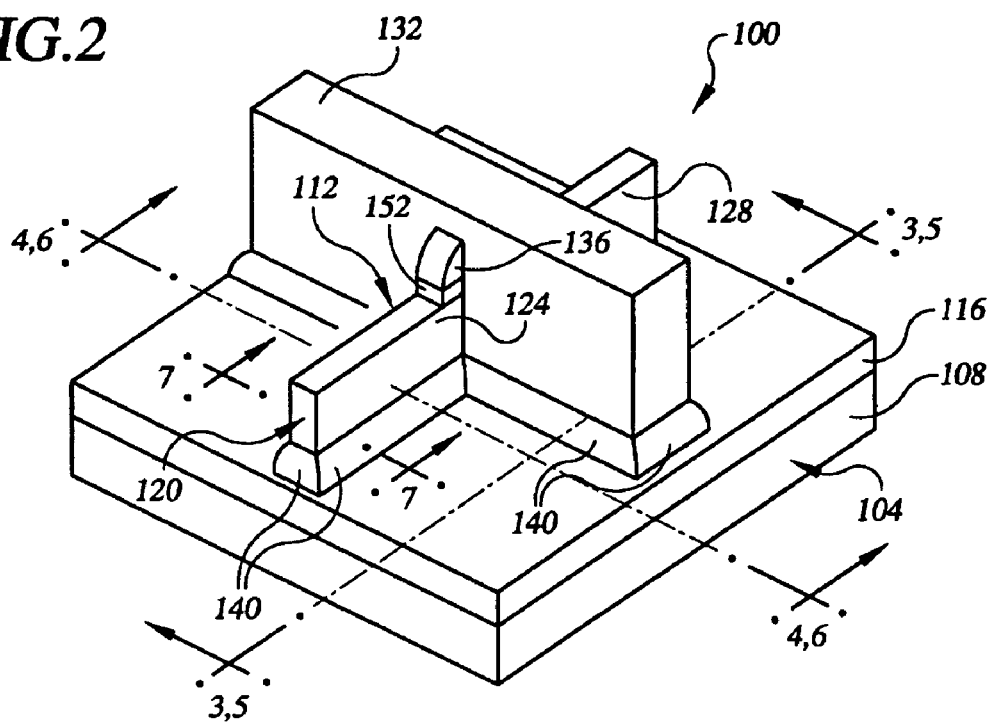
FIG. 2 is a perspective view of a finFET made in accordance with the present invention and having sidewall spacers.

Referring again to the drawings, FIG. 2 shows a finFET 100 made in accordance with the present invention. FinFET 100 may be fabricated on a wafer, e.g. SOI wafer 104, that includes a lower layer 108 comprising a semiconductor material, e.g., silicon, an upper layer 112 comprising a semiconductor material, and an oxide layer, e.g., BOX layer 116, located between the lower and upper layers. As shown, most of upper layer 112 has been removed from its surface down to BOX layer 116 to form the fin 120 of finFET 100, that contains the source 124, drain 128 and channel (not shown) of the finFET. After fin 120 has been formed, gate 132 is formed over the central portion, i.e., the channel, of the fin. As discussed below, to best facilitate one aspect of the invention, the vertical thickness of the portion of gate 132 atop fin 120 should preferably be about equal to or greater than the height of the fin. Gate 132 may be made of any suitable material, such as polysilicon. Those skilled in the art will appreciate that while finFET 100 is shown as having only one fin 120 defining a single source 124 and single drain 128, it may have as many fins as needed to suit a design. Those skilled in the art will also appreciate that the number of fins 120 will also depend upon other factors, such as the physical size of finFET 100 and its operating voltage and current, among other things.

Figure 1A:
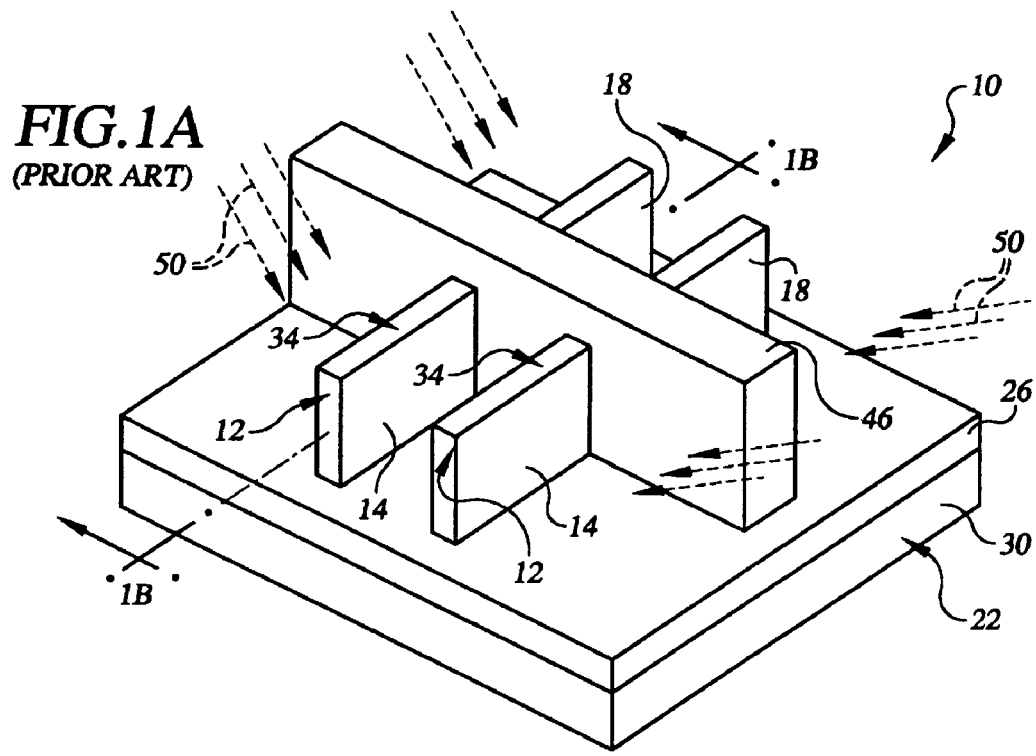
FIG. 1A is a perspective view of a prior art finFET.
Figure 1B:
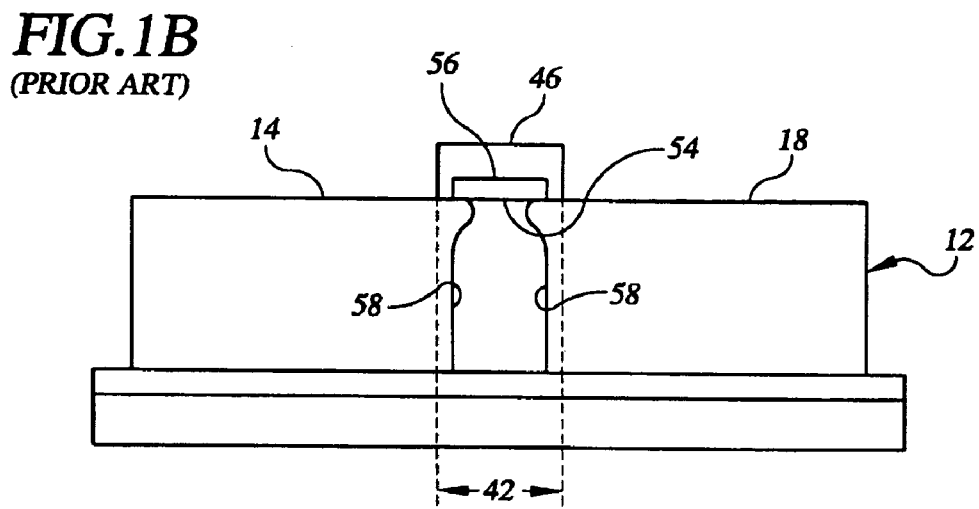
FIG. 1B is a cross-sectional view of the finFET of FIG. 1A as taken along the line 1B—1B illustrating the profile of doping concentration of dopant atoms diffused into the channel from the source and drain.

FinFET 100 includes a plurality of sidewall spacers 136 formed above the upper surface of fin 120 adjacent gate 132 that generally prevent a parasitic device from being formed proximate the top of the channel, e.g., parasitic device 54 of FIG. 1B discussed in the Background section above. FinFET 100 may also include a plurality of sidewall spacers 140 formed atop BOX layer 116 adjacent fin 120 and gate 132 that may fill in any undercut regions 144 (FIG. 7) that may be formed during prior processing steps, as also discussed above in the Background section. The formation and function of spacers 136, 140 are described below in detail.

Figure 3:
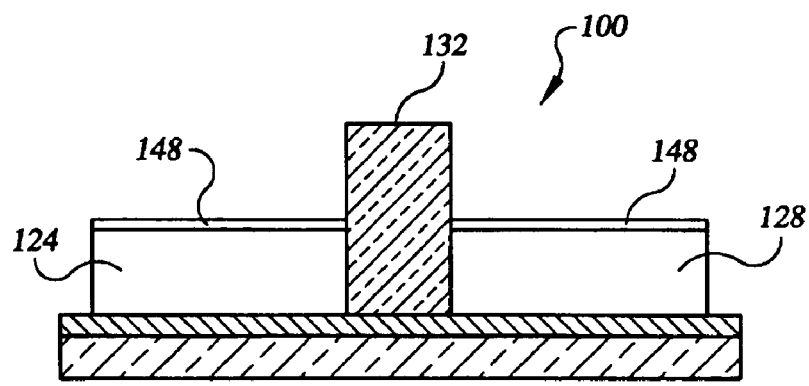
FIG. 3 is a cross-sectional view of the finFET of FIG. 2 as taken along line 3—3 of FIG. 2 showing the finFET prior to the process of forming sidewall spacers.
Figure 4:
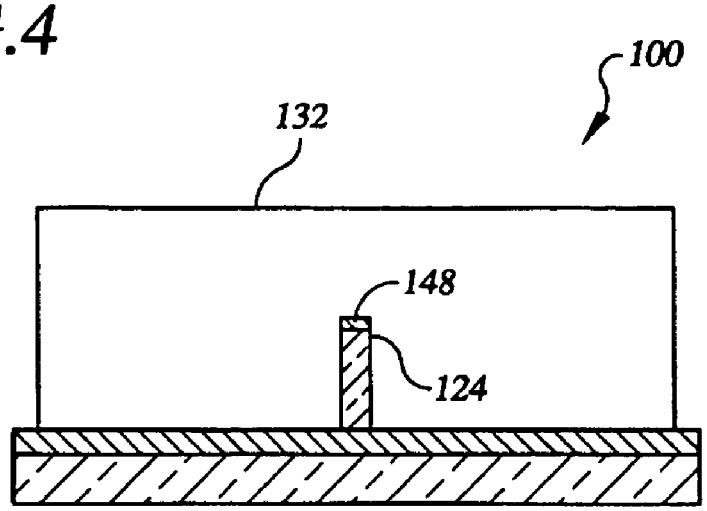
FIG. 4 is a cross-sectional view of the finFET of FIG. 2 as taken along line 4—4 of FIG. 2 showing the finFET prior to the process of forming sidewall spacers.

Referring now to FIGS. 3 and 4, and also occasionally to FIG. 2, FIGS. 3 and 4 show finFET 100 prior to the formation of spacers 136, 140. Particularly, FIGS. 2 and 3 show the presence of hardmask 148 atop fin 120. Hardmask 148 is provided for the formation of fin 120 by etching upper layer 112 of SOI wafer 104 to form the fin. Hardmask 148 may be made of any suitable material that is resistant to the anisotropic etching process used to etch upper layer 112 to form fin 120. When upper layer 112 comprises silicon, hardmask 148 may be made of silicon dioxide. A remnant 152 of hardmask 148 is seen in FIG. 2, beneath spacer 136. Although not shown, hardmask 148 is present beneath gate 132 and is thus continuous along the length of fin 120. It is noted that hardmask 148 on top of source 124 and drain 128 can become largely etched away during the formation of gate 132 due to the etching involved with forming the gate.

As discussed in the Background section above, a problem that can plague a finFET is the formation of a parasitic device (e.g., parasitic device 54 of FIG. 1B) in the upper region of the channel beneath the gate. Again, this parasitic device is a result of the additional doping that the upper portion of the source and drain receive during the doping of both sides of the source and drain using conventional ion implanting techniques and/or the undercutting of hardmask 56 (FIG. 1B) during removal of the exposed portions of the hardmask following the formation of gate 46. The additional doping is particularly problematic immediately adjacent a gate, since it is the dopant atoms in this region that tend to diffuse into the channel, thereby causing the parasitic device. Additional doping can be compounded by more dopant atoms being implanted in channel 142 due to the isotropic etch of hardmask 56 that causes undercutting of gate 46. Sidewall spacers 136 of finFET 100 can inhibit both undercutting of gate 132 and doping at these critical regions of source 124 and drain 128 by blocking dopant atoms from entering into the source and drain in these regions. By blocking such doping and/or undercutting, the amount of dopant atoms that diffuse, and/or are implanted, into the channel is largely reduced, if not eliminated, thereby reducing or eliminating the effect of the parasitic device that would otherwise be present at the top of the channel after source 124 and drain 128 are doped.

Figure 5:
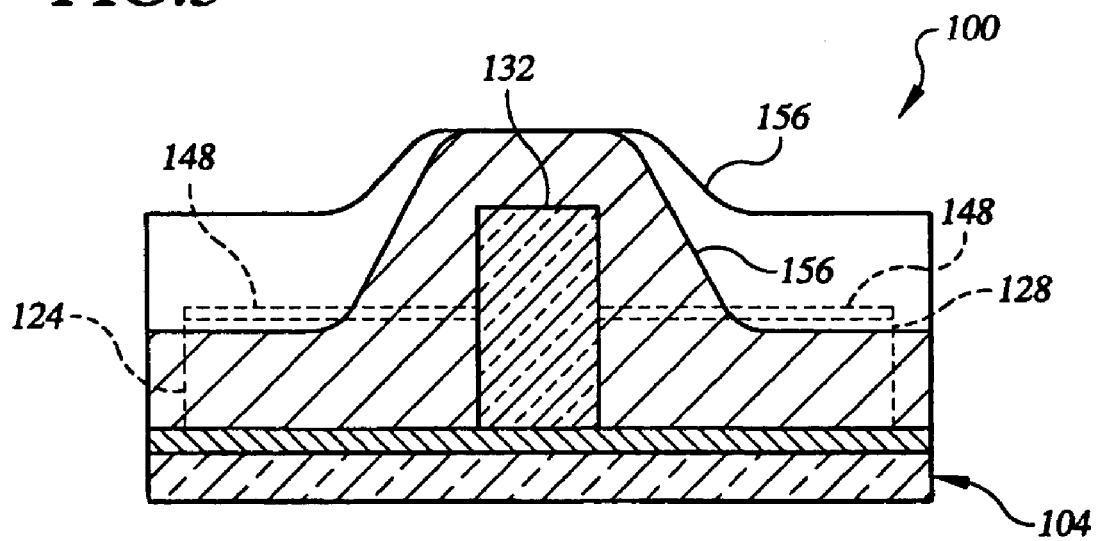
FIG. 5 is a cross-sectional view of the finFET of FIG. 2 as taken along line 5—5 of FIG. 2 showing the finFET during the process of forming sidewall spacers.
Figure 6:
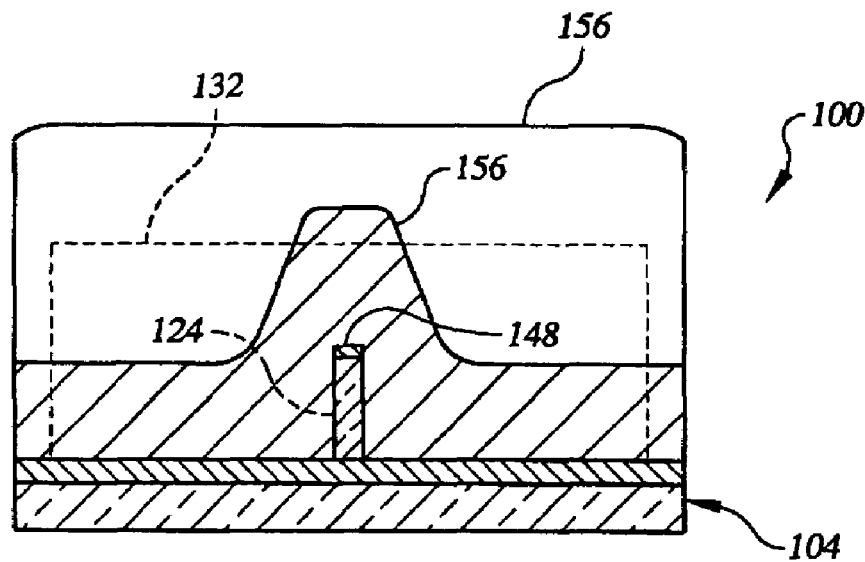
FIG. 6 is a cross-sectional view of the finFET of FIG. 2 as taken along line 6—6 of FIG. 2 showing the finFET during the process of forming sidewall spacers.

FIGS. 5 and 6 are similar to FIGS. 3 and 4 but show finFET 100 during the process of forming spacers 136, 140. Referring to FIGS. 2, 5 and 6, to form spacers 136, 140, a layer 156 of material, such as a thermal oxide, e.g., a silicon oxide formed using tetraethylorthosilicate (TEOS), or silicon nitride, among others, may be deposited over finFET 100. After layer 156 has been formed, it may be etched so as to form spacers 136, 140. One or more highly anisotropic etching techniques, such as reactive ion etch (RIE), may be used to favorably control etching so as to leave a suitable amount of the material at each reentrant corner formed where a vertical surface meets with a horizontal surface. In the present context, and in the appended claims, the term "vertical" means the direction that is at least substantially normal to the original upper surface of SOI wafer 104. Correspondingly, the term "horizontal" means a direction parallel to the original upper surface of wafer 104. With a suitable amount of overetching, whatever remains of hardmask 148 atop source 124 and drain 128 beyond spacers 136 may be removed in addition to the removal of regions of layer 156 to form spacers 136, 140. Caution should be exercised, however, to limit overetching, since excessive overetching can result in entire layer 156 being removed, including spacers 136, 140.

To make spacers 136 on top of fin 120 roughly the same height as spacers 140 at the base of the fin, the vertical thickness of gate 132 above the fin should about the same as the height of the fin. Of course, if the vertical thickness of gate 132 above fin 120 is greater than the height of the fin, spacers 136 will generally have a height greater than the height of spacers 140. Similarly, if the vertical thickness of gate 132 above fin 120 is less than the height of the fin, spacers 136 will generally have a height smaller than the height of spacers 140. If the vertical thickness of gate above fin 120 is too small, spacers 140 may form, but spacers 136 may not.

If desired, several types of etching may be used with one another to control the size of spacers 136, 140 remaining after etching. For example, RIE may be used up to a certain amount of overetching. The limited RIE overetch may be followed by a chemical oxide removal (COR) etch to remove remnants of hardmask 148 while leaving spacers of a suitable size. Those skilled in the art will appreciate that the deposition and etching of layer 156 and/or hardmask 148 so as to form spacers 136, 140 and/or remove remnants of the hardmask in regions out from under spacers 136 may be done in a variety of ways and that determining the thickness of layer 156 and etching parameters will vary with the configuration and/or size of the components of finFET 100. Accordingly, those skilled in the art will also appreciate that it is not necessary to describe all possible ways to deposit and etch layer 156 for those skilled in the art to appreciate and understand the scope of the present invention.

Figure 7:
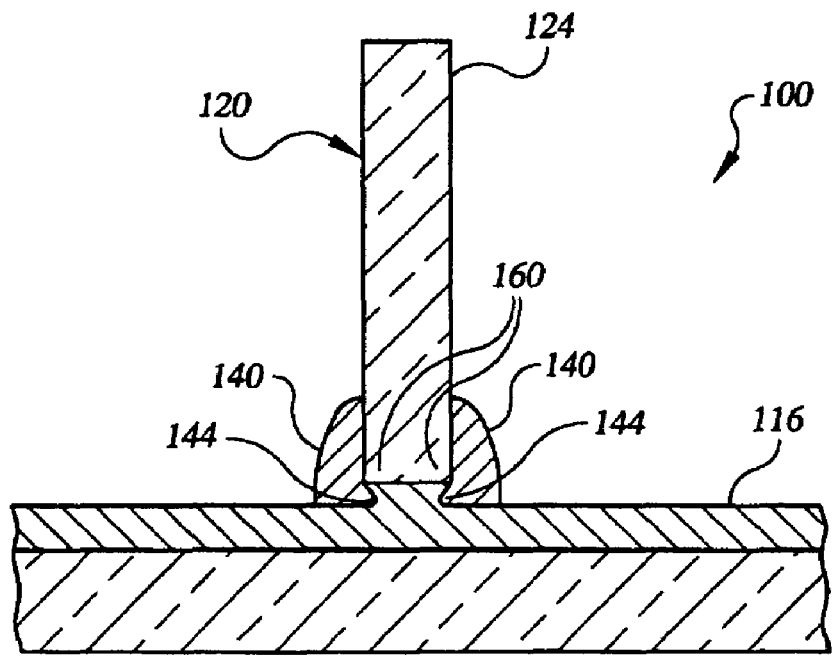
FIG. 7 is a cross-sectional view of the finFET of FIG. 2 as taken along line 7—7 of FIG. 2 showing sidewall spacers at the bottoms of the drain filling in the undercut region of the BOX layer.

In addition to the additional-doping/parasitic channel device problem discussed above and in the Background section, parasitic devices can be formed at the bottoms of source 124 and drain 128 due to undercutting of BOX layer 116. Referring to FIG. 7, as mentioned above, etching involved with the formation of the components of finFET 100 can result in the overetching of BOX layer 116 so as to form undercut regions 144 beneath fin 120. This undercutting results in parasitic corner-type devices 160 in source 124 and drain (not shown in FIG. 7). However, using the technique of the present invention to form spacers 140, undercut regions 144 may be filled by the material used to create the spacers. The presence of such material in undercut regions 144 generally lessens the severity of effect of parasitic devices 160 due to the undercutting.

Figure 8:
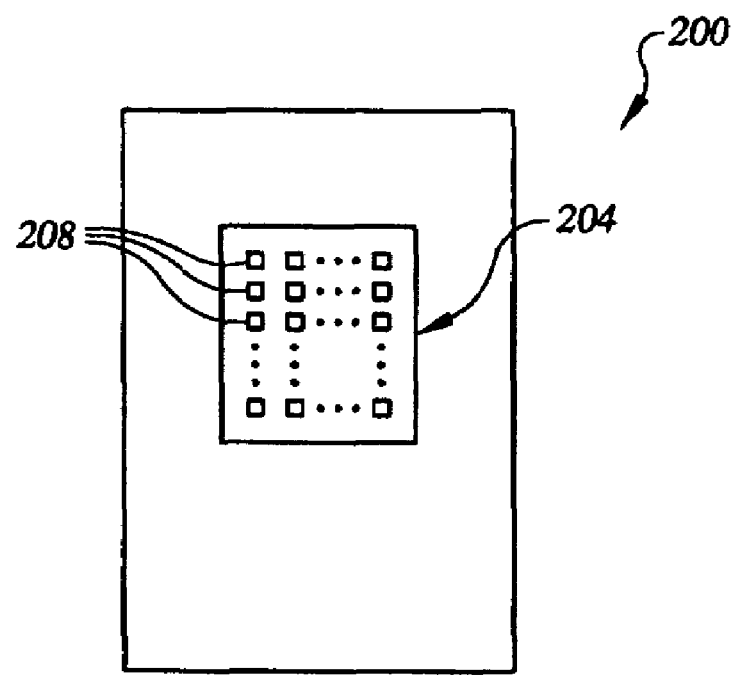
FIG. 8 is a highly schematic diagram of a device of the present invention that includes an integrated circuit containing a plurality of finFETs similar to the finFET of FIG. 1.

FIG. 8 illustrates a device 200 that comprises an integrated circuit 204 that contains a plurality of finFETs 208, which may be the same as or similar to finFET 100 of FIGS. 2–7. Integrated circuit (IC) 204 may be a microprocessor, application specific integrated circuit (ASIC), or any other type of IC. Accordingly, device 200 may be any type of device that typically contains such an integrated circuit. Examples of these devices include computers, cellular telephones, PDAs, thin clients, televisions, radios, domestic appliances, e.g., digital microwave ovens, dishwashers, clothes dryers and the like, automobiles, digital manufacturing, testing and diagnostic equipment and virtually any digital device for consumer or industrial use. Those skilled in the art will appreciate that in order to understand the present invention it is not necessary to describe the general function of IC 204, nor the details of how the IC interfaces with a power supply (not shown) and other components (not shown) of device 200 that provide its functionality. In addition, those skilled in the art are familiar with the various functions 204 may be designed to provide and how to interface the IC with a power supply and other components. However, a unique aspect of device 200 is that as discussed above, each finFET 208 of IC 204 generally include spacers 136 (FIG. 2) present substantially at the reentrant corners formed by the upper surfaces of each fin 120 with the respective side of gate 132. In addition, when undercut regions 144 (FIG. 7) are present beneath the fin(s) 120 of each finFET 208, the undercut regions may also be filled with the material of spacers 140 (FIGS. 2 and 7).

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

The invention claimed is:

1. A device, comprising:
   an integrated circuit formed on a substrate and comprising a plurality of FETs wherein at least some of said plurality of FETs are finFETs each comprising:
   a) a fin having a source portion, a drain portion and a channel portion extending between said source portion and said drain portion, said fin having a base portion disposed on said substrate, each of said source portion and said drain portion having an upper surface, said fin having a length extending from, and including, said source portion and said drain portion and each of said source portion and said drain portion including an upper surface having a width;
   b) a first spacer formed adjacent said base portion;
   c) a gate located at said channel portion;
   d) a first reentrant corner between said upper surface of said source portion and said gate;
   e) a second reentrant corner between said upper surface of said drain portion and said gate;
   f) a second spacer proximate said first reentrant corner and having a length extending alone said gate substantially equal to said width of said source portion immediately adjacent said gate; and
   g) a third spacer proximate said second reentrant corner and having a length extending along said gate substantially equal to said width of said drain portion immediately adjacent said gate.

2. A device according to claim 1, further comprising a first hardmask remnant located substantially only between said second spacer and said upper surface of said source and a second hardmask remnant located between said third spacer and said upper surface of said drain portion.

3. A device according to claim 1, wherein said first spacer comprises silicon dioxide.

4. A device according to claim 1, wherein said substrate comprises an undercut region beneath at least a portion of said fin, said undercut region containing at least a portion of said first spacer.

5. An integrated circuit, comprising:
 a) a substrate; and
 b) a plurality of FETs formed on said substrate, wherein at least some of said plurality of FETs are finFETs each comprising:
  i) a fin that includes a source having a base disposed on said substrate and further includes a drain and a channel extending between said source and said drain, said fin having a length extending from, and including, said source and said drain portion, and each of said source portion and said drain including an upper surface having a width; and
  ii) a first spacer formed at least adjacent the entire said base portion of said source;
 c) a gate located at said channel;
 d) a first reentrant corner between said upper surface of said source and said gate;
 e) a second reentrant corner between said upper surface of said drain and said gate;
 f) a second spacer proximate said reentrant corner and having a length extending along said gate substantially equal to said width of said source immediately adjacent said gate; and
 g) a third spacer proximate said second reentrant corner and having a length extending alone said gate substantially equal to said width of said drain immediately adjacent said gate.

6. An integrated circuit according to claim 5, further comprising a first hardmask remnant located between said second spacer and said upper surface of said source and a second hardmask remnant located between said third spacer and said upper surface of said drain.

7. An integrated circuit according to claim 5, wherein said first spacer comprises silicon dioxide.

8. An integrated circuit according to claim 5, wherein said substrate comprises an undercut region beneath at least a portion of said fin, said undercut region containing at least a portion of said first spacer.

9. A finFET formed on a substrate, comprising:
 a) a fin having a source, a drain and a channel extending between said source and said drain, said fin having a length extending from, and including, said source and said drain, and each of said source and said drain including an upper surface having a width;
 b) a gate located at said channel;
 c) a first reentrant corner between said upper surface of said source and said gate;
 d) a second reentrant corner between said upper surface of said drain and said gate;
 e) a first spacer proximate said first reentrant corner and having a length extending along said gate substantially equal to said width of said source immediately adjacent said gate; and
 f) a second spacer proximate said second reentrant corner and having a length extending along said gate substantially equal to said width of said drain immediately adjacent said gate.

10. A finFET according to claim 9, wherein each of said source and said drain includes a base attached to the substrate, the finFET further comprising a third spacer formed adjacent the base of said source.

11. A finFET according to claim 9, further comprising a first hardmask remnant located substantially only between said first spacer and said upper surface of said source and a second hardmask remnant located substantially only between said second spacer and said upper surface of said drain.

12. A finFET according to claim 9, wherein said first spacer comprises silicon dioxide.

13. A finFET according to claim 9, wherein the substrate comprises an undercut region beneath at least said base of said source, the undercut region containing at least a portion of said first spacer portion.

* * * * *